(12) United States Patent
Eusterholz et al.

(10) Patent No.: US 7,336,497 B2
(45) Date of Patent: Feb. 26, 2008

(54) ELECTRONICS HOUSING

(75) Inventors: Helmut Eusterholz, Paderborn (DE); Frank Best, Bueckeburg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 11/737,907

(22) Filed: Apr. 20, 2007

(65) Prior Publication Data

US 2007/0246256 A1    Oct. 25, 2007

(30) Foreign Application Priority Data

Apr. 22, 2006    (DE) ................. 20 2006 006 615 U (51) Int. Cl.
*H05K 7/16* (2006.01)
(52) U.S. Cl. ...................... 361/725; 361/729
(58) Field of Classification Search ................ 361/725, 361/729, 785, 812, 829
See application file for complete search history.

(56) References Cited

U.S. PATENT DOCUMENTS

| | | | |
|---|---|---|---|
| 5,046,172 A * | 9/1991 | Moreux et al. ............. | 361/601 |
| 5,602,363 A | 2/1997 | Von Arx | |
| 5,808,876 A * | 9/1998 | Mullenbach et al. ....... | 361/788 |
| 6,456,495 B1 * | 9/2002 | Wieloch et al. ............. | 361/729 |
| 6,631,076 B2 * | 10/2003 | Behr et al. .................. | 361/641 |
| 6,654,255 B2 * | 11/2003 | Kruse et al. ................ | 361/799 |
| 7,239,521 B2 * | 7/2007 | Quero et al. ................ | 361/725 |
| 2003/0143896 A1 | 7/2003 | Bet et al. | |

FOREIGN PATENT DOCUMENTS

| | | |
|---|---|---|
| DE | 19610037 | 9/1997 |
| DE | 19709554 | 6/1998 |
| DE | 29720511 | 8/1998 |
| EP | 0463547 | 1/1992 |

OTHER PUBLICATIONS

Phoenix Contact, Catalogue COMBICON 200511, pp. 378-393, undated.

* cited by examiner

*Primary Examiner*—Hung V. Ngo
(74) *Attorney, Agent, or Firm*—Darby & Darby (57) ABSTRACT

An electronics housing for placement on a support rail includes a base part and an upper part. The base part and the upper part can be detachably connected to one another, and the base part can be snapped to the support rail. Two housing side walls having fasteners are disposed opposite to each other and are disposed parallel to each other. The housing side walls are also disposed perpendicular to the support rail. A circuit board is disposed parallel to the support rail using the fasteners. At least two connection terminals or plug-in connectors are provided for connecting the electrical conductors. The connection terminals are electrically connectable to the circuit board.

20 Claims, 8 Drawing Sheets

ELECTRONICS HOUSING

CROSS-REFERENCE TO RELATED APPLICATIONS

The present application claims priority to German patent application DE 20 2006 006 615.2, filed Apr. 22, 2006, which is hereby incorporated by reference as if set forth in its entirety.

The present invention relates to an electronics housing, in particular, an electronics housing which is placed on a support rail.

BACKGROUND

With the trend for increasing control and automation of sequences both in the industrial field and also in the household field, and with simultaneous decentralization of electronics directly into the process as well as miniaturization of electronic assemblies into compact, easy-to-assemble devices, suitable electronics housings are increasingly required, the connection technology typically also being integrated in the housing. The individual housings are typically mounted directly on a support rail and are preferably connected to one another and to a controller via a bus system.

Depending on the application, there are manifold different housing forms for this purpose, which differ in their size, construction, and function. All of these housings share the feature that electronic assemblies, usually in the form of circuit boards, are situated in their interiors, which are protected from contact and dirt by the electronics housing. Housings of this type are usually constructed modularly, the housings particularly being implemented according to the building block principle, so that the individual housing parts may be assembled individually and rapidly to form an optimal housing.

The housing of the traditional type frequently comprises a housing upper part and a housing lower part, the housing upper part having terminals for electrical lines, the terminals being connected via plug-in contacts to the housing lower part, and the housing lower part producing the connection to a bus system. The individual housings are implemented in such a way that multiple housings may be snapped neighboring one another on a support rail, so that multiple housings together form a housing block. The individual neighboring housings or the individual neighboring electronic devices may preferably be electrically contacted with one another.

Housings of this traditional type are attached to the support rail in such a way that a locking element is situated in the housing bottom, the locking element engaging with the support rail when the housing is placed on the support rail. In order to remove the housing, and thus also the electronic device, from the support rail, the engagement described above must be disengaged, for which purpose the locking element, which is typically spring-loaded, must be retracted against its spring force.

As described in the PHOENIX CONTACT Catalogue COMBICON 200511, pages 378 through 393, which is hereby incorporated by reference as if set forth in its entirety, simple mounting of the housings on the support rail and also simple connection of neighboring electronics housings to one another are possible, but the individual housings may only be adapted to different devices in a limited way. In particular, in the event of a subsequent change of the electronics of the device, another housing is usually necessary.

SUMMARY

The present invention provides an electronics housing for placement on a support rail. The electronics housing includes a base part having a socket part configured to cooperate with the support rail, and an upper part which can be detachably connected to the base part. Two housing side walls having fasteners are disposed opposite to each other and are disposed parallel to each other. The housing side walls are also disposed perpendicular to the support rail. A circuit board is disposed parallel to the support rail using the fasteners, and at least two connection terminals are electrically connectable to the circuit board and configured for connecting electrical conductors.

BRIEF DESCRIPTION OF THE DRAWINGS

Exemplary embodiments of the present invention are explained in more detail below with reference to the accompanying drawings, in which.

DETAILED DESCRIPTION

One aspect of the present invention is to refine the electronics housing of traditional devices in such a way that it may be used even more flexibly, so that the electronics housing may be adapted better to the particular requirements.

The present invention provides an electronics housing having two housing side walls, arranged opposite to each other and essentially perpendicular to the support rail, with a plurality of fastening means such that the circuit board can be accommodated parallel to the support rail.

The present invention also provides an electronics housing with the circuit board situated in the base part, and the base part has two side walls situated on diametrically opposite sides, perpendicular to the support rail and extending toward the circuit board. Multiple fasteners, in particular multiple openings, may be implemented in the side walls in such a way that further circuit boards may be engaged, as needed, in the fasteners in at least two spatial directions, which are perpendicular to one another. The implementation of the electronics housing according to the present invention thus allows, in addition to the circuit board situated horizontally in relation to the base of the electronics housing, which is also referred to in the following as the base circuit board, further circuit boards to be accommodated in the housing, both the position and also the number of the further circuit boards being variable.

In addition to the embodiments described above, further circuit boards may be alternately engaged in the fasteners of the side walls of the base part at least two spatial directions perpendicular to one another. For example, two or three circuit boards may be situated parallel to one another and parallel to the base circuit board in the electronics housing. Two or more circuit boards may also be mounted parallel to one another and perpendicular to the base circuit board in the electronics housing. The fasteners implemented in the side walls of the base part thus allow mounting of the further circuit boards in electronics housing in at least two positions perpendicular to one another.

Typically, all further circuit boards will be situated parallel to one another, i.e., all of them are situated either horizontal or vertical in relation to the base of the electronics housing. However, it is also possible for one of the further circuit boards to be situated perpendicular to the base circuit board and the remaining further circuit boards to be situated parallel to the base circuit board, for example.

According to a preferred embodiment of the electronics housing according to the present invention, multiple circuit board guides are implemented in the upper part, through which the further circuit boards may be fixed in their position or location. It is thus possible, with appropriate arrangement and assignment of the fasteners in the side walls of the base part and the circuit board guides in the upper part for the further circuit boards, to be able to be situated in all three spatial directions in the electronics housing.

If the further circuit boards are situated parallel to the base circuit board, fixing a circuit board using the fasteners implemented in the side walls of the base part is typically sufficient. This is correspondingly also true when the further circuit boards are oriented perpendicular to the base circuit board and perpendicular to the two side walls of the base part. In this case as well, the circuit boards may be inserted into the openings in the side walls using retention lugs mounted or milled on the front faces of the circuit boards. If the further circuit boards are situated perpendicular to the base circuit board and parallel to the side walls of the base part in the electronics housing, it may only be possible to fix the position of the further circuit boards using the circuit board guides implemented in the upper part, unless via a mechanical connection to the base circuit board.

Depending on the arrangement of the further circuit boards in the electronics housing, there are various possibilities for connecting the individual circuit boards to one another and to the base circuit board. If the further circuit boards are situated perpendicular to the base circuit board, the individual circuit boards may be electrically connected to one another via the base circuit board. If the further circuit boards are situated parallel to the base circuit board, the individual circuit boards are preferably electrically connected to one another and also to the base circuit board using plug contacts implemented on the circuit boards. The plug contacts may be implemented as blade contacts, so that the individual circuit boards each have contact blades and forked contact receptacles corresponding to one another on their two diametrically opposite sides, so that the contact blades of one circuit board engage in the forked contact receptacles of the neighboring circuit board.

According to a further preferred embodiment, the electronics housing according to the present invention is implemented in such a way that electronics housings situated neighboring one another are automatically electrically connected to one another via a bus system when they are snapped onto a support rail. According to the present invention, this is advantageously performed using a bus connector situated in the support rail, for which an opening is implemented in the bottom of the base part, and the base circuit board has corresponding contacts which extend through the opening, so that when the base part is placed on the support rail, the contacts situated in the base circuit board automatically contact corresponding counter contacts of the bus connector.

The support rail bus connector is implemented in such a way that it may be plugged together with further bus connectors situated neighboring in the support rail to form a bus connection or bus line, through which an automatic contact from device to device may be produced. Both the power supply of the electronic components situated in the individual electronics housing and also the power supply of electrical devices situated on the connection terminals may be produced via the transverse connection produced by the bus connector. In addition, neighboring devices may communicate with one another via the bus connection implemented in this way. Both the serial and parallel data transmission and also the power supply may thus be performed via the bus connection.

The use of a support rail bus connector additionally also has the advantage that plugging or pulling individual electronics housings or the devices situated in the electronics housings does not result in an interruption of the bus connection. Individual devices may thus be replaced easily in case of flaw without interrupting signal flow. Moreover, functional expansions may be performed without problems without additional wiring.

In order to prevent undesired lifting off of an electronics housing from the support rail, the base part preferably has a lock. The base part, and thus the electronics housing as a whole, is removably connectable to the support rail via the lock. The lock may have at least one spring-loaded bolt situated displaceably in the base part which engages below a leg of the support rail in the locked position using a catch lug. If the electronics housing is to be intentionally removed from the support rail, the spring-loaded bolt may be retracted by inserting the tip of a screwdriver into an opening provided for this purpose, so that the catch lug releases the support rail and the electronics housing may be lifted off of the support rail.

According to another embodiment of the electronics housing according to the present invention, a cover is particularly situated pivotally on the upper part. The cover may be implemented as transparent or in the housing color as desired. Different possibilities for fixing the cover on the upper part are also possible. If the cover is made of a transparent material, different display elements, such as different status LEDs, or different operating elements, such as buttons or setting potentiometers, may be situated below the cover. Otherwise, a receptacle space implemented below the cover may be used for receiving a device specification or operating instructions.

Figure 1:
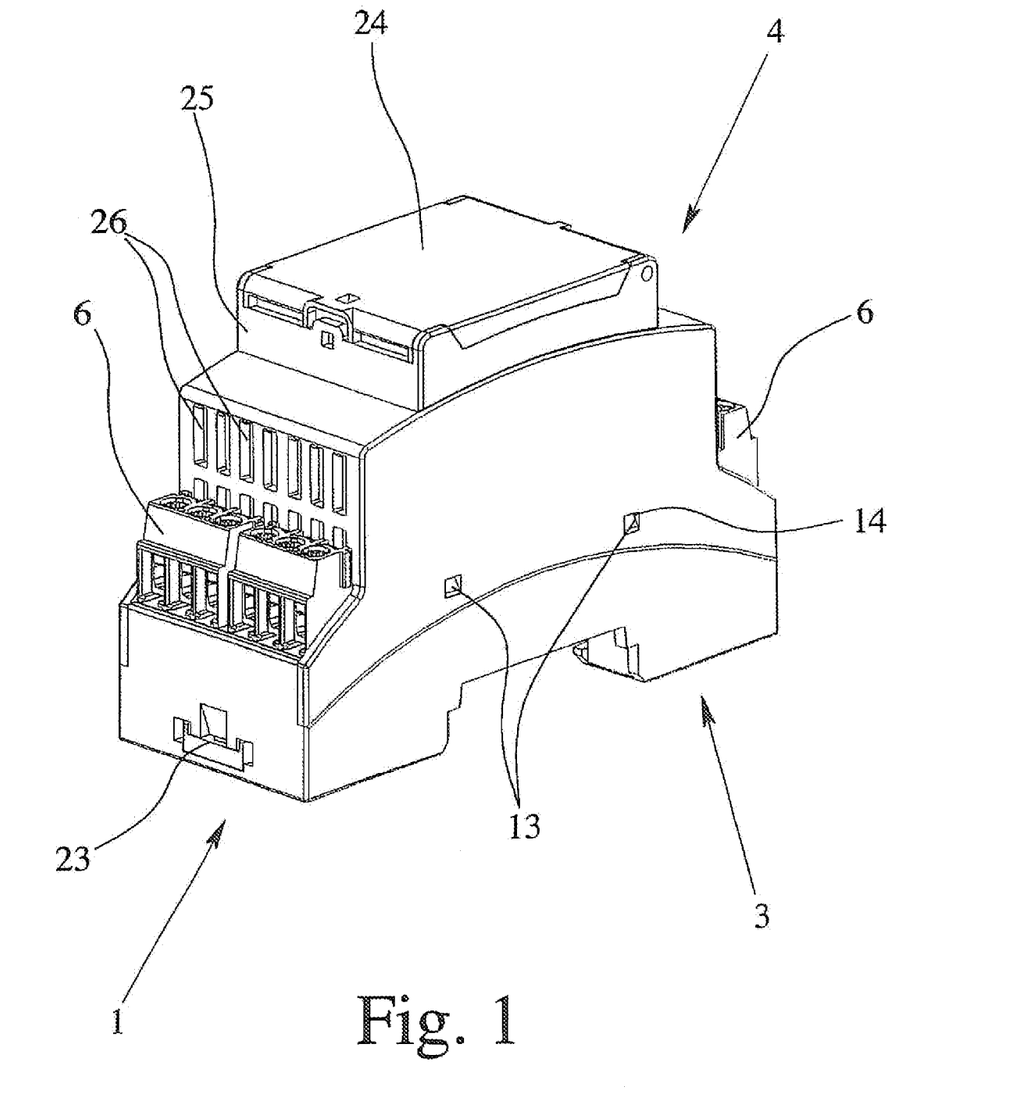
FIG. 1 is a perspective view of an electronics housing according to a first embodiment of the present invention.
Figure 8:
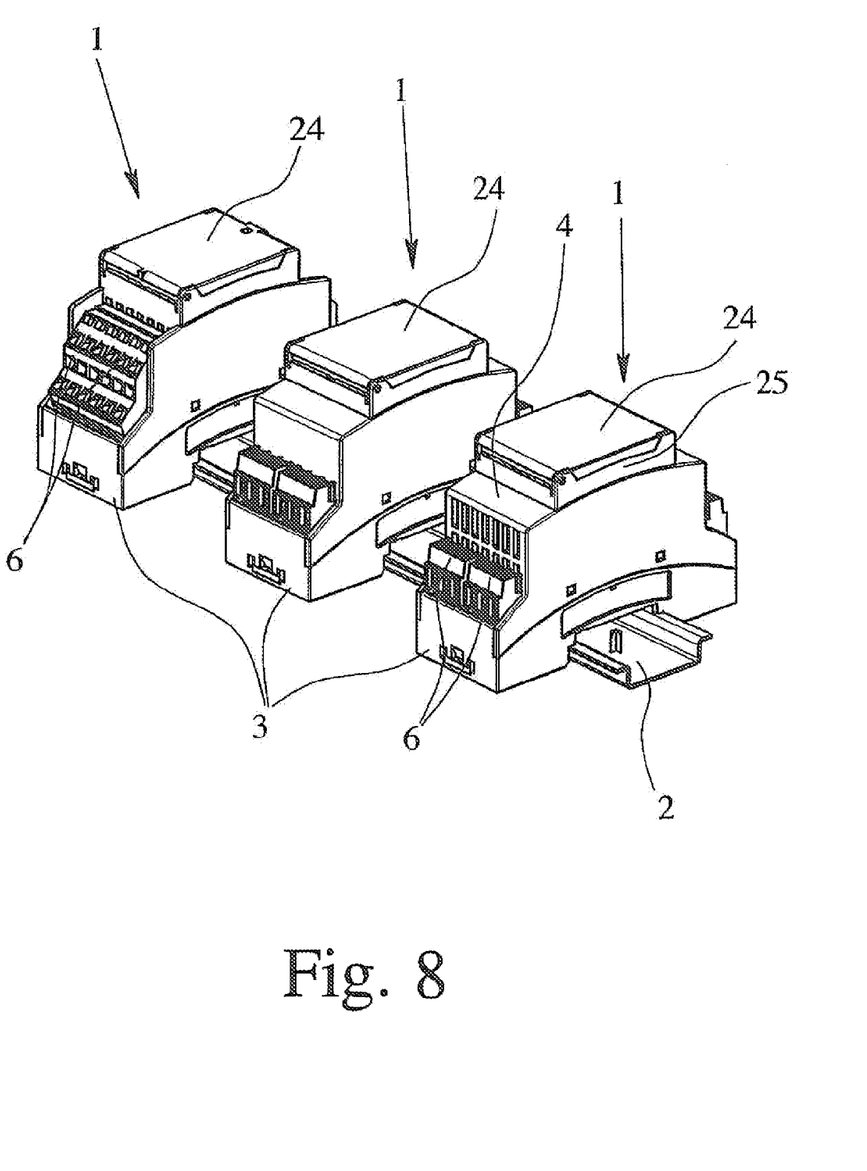
FIG. 8 is a perspective view of three exemplary embodiments of an electronics housing according to the present invention, situated on a common support rail.

FIG. 1 illustrates an electronics housing 1 which may be snapped onto a standardized support rail 2, as shown in FIG. 8. The electronics housing 1 has a base part 3 and an upper part 4. The base part 3 includes a circuit board 5 and multiple connection terminals 6 connected to the circuit board 5.

The circuit board 5, which is also referred to in the following as the base circuit board 5, is situated in the base part 3, for which corresponding catch lugs or catch recesses are implemented in the base part 3. Multiple lines may be connected via the base circuit board 5 to the electronic device and/or the electronics which is/are enclosed by the electronics housing 1 with the aid of the connection terminals 6. Because of the flexibility of the electronics housing 1, which will be described in more detail in the following, different electronic devices, in particular different electronic units may be situated inside the electronics housing 1.

Figure 2:
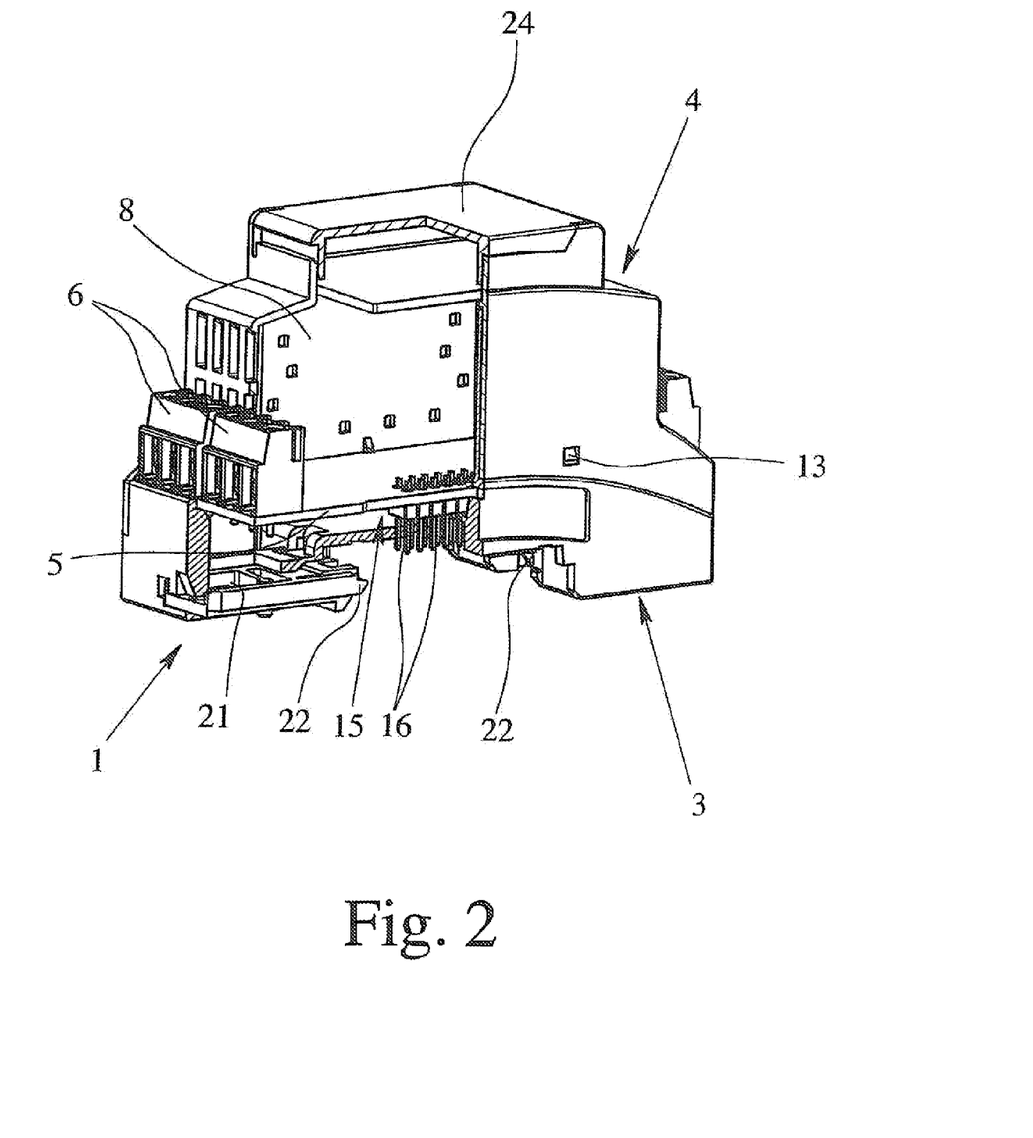
FIG. 2 is a partial cut-away view of an electronics housing according to a second embodiment of the present invention.
Figure 4:
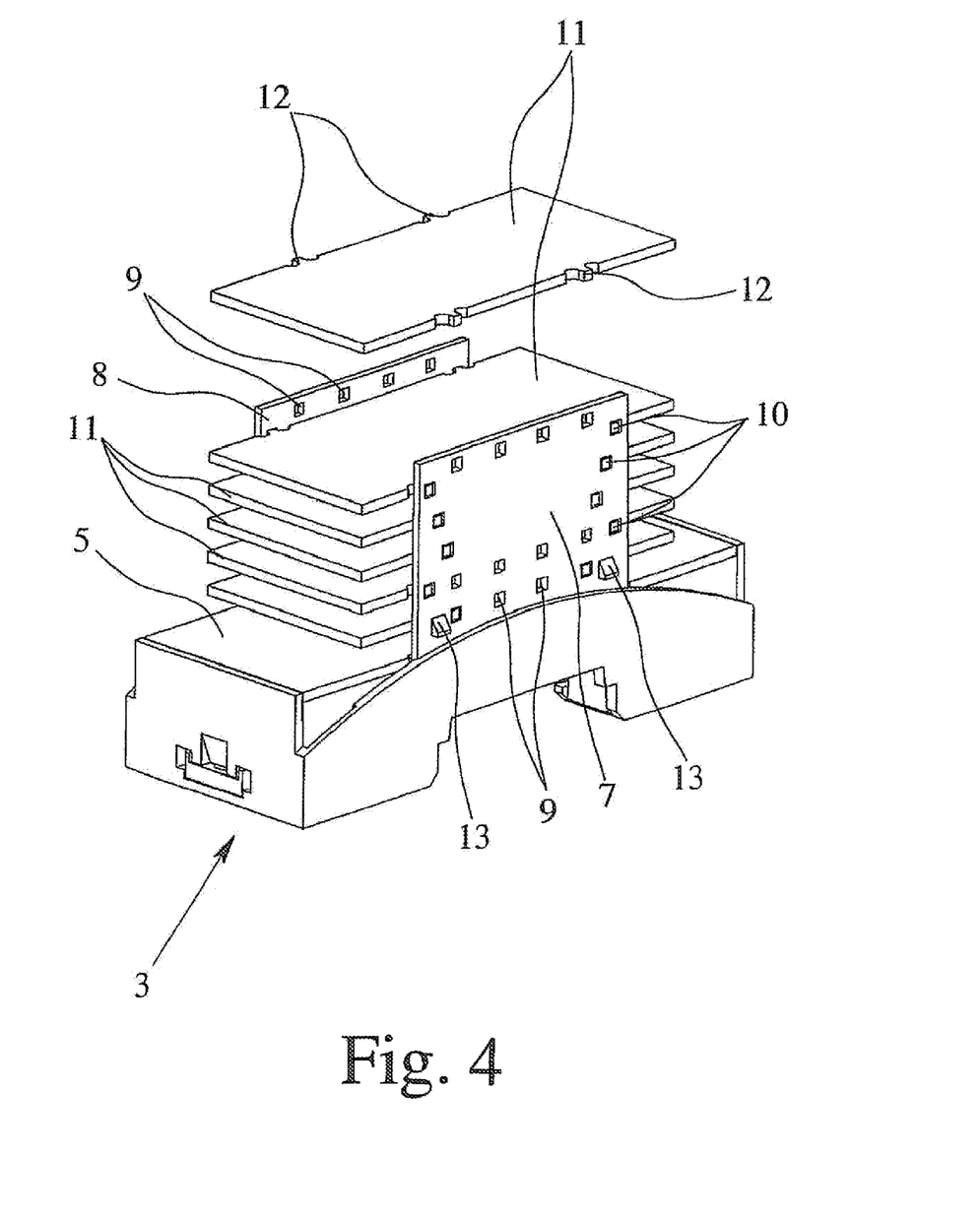
FIG. 4 is a perspective view of a base part of the electronics housing according to a third embodiment of the present invention.
Figure 5:
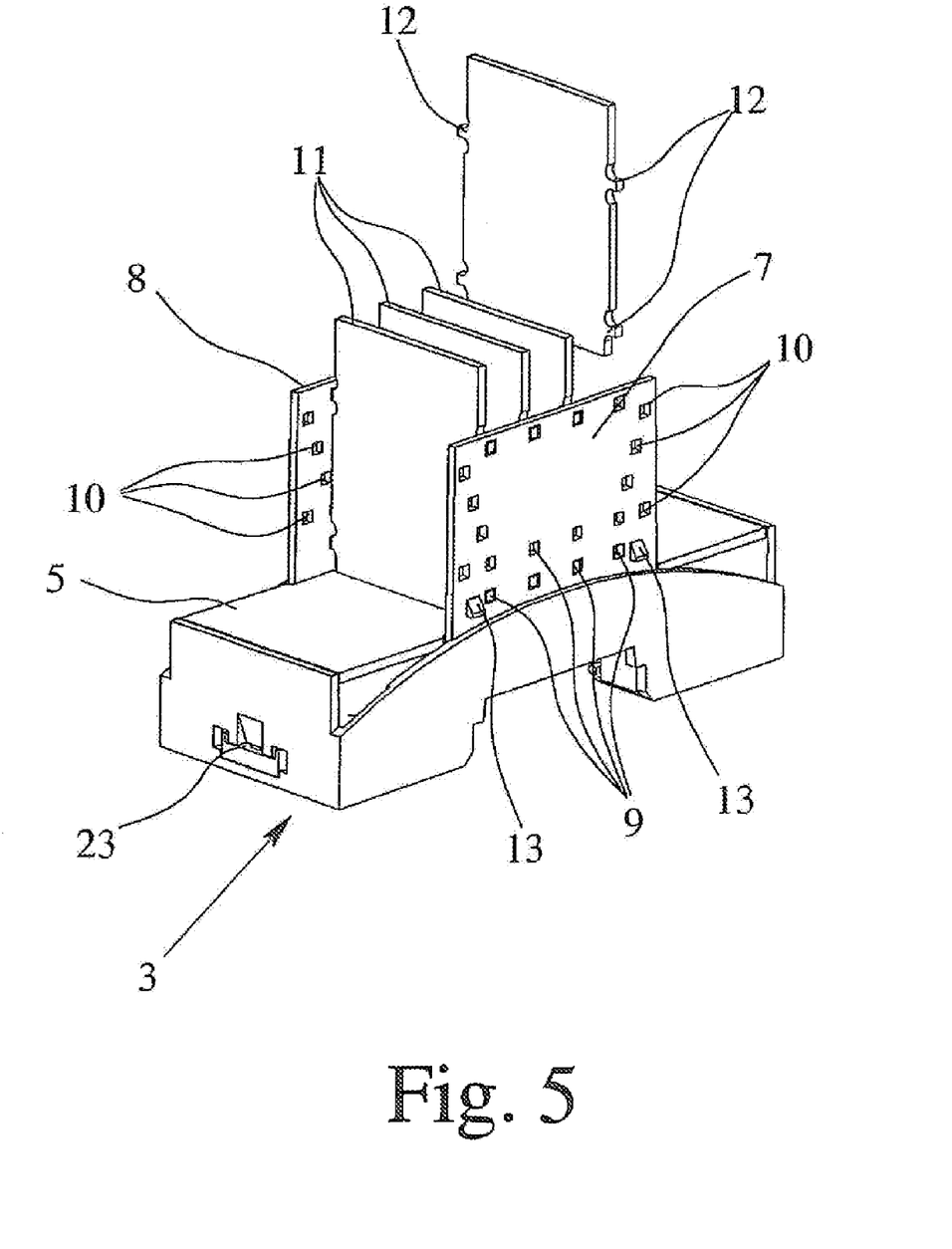
FIG. 5 is a perspective view of a base part of the electronics housing according to a fourth embodiment of the present invention.
Figure 6:
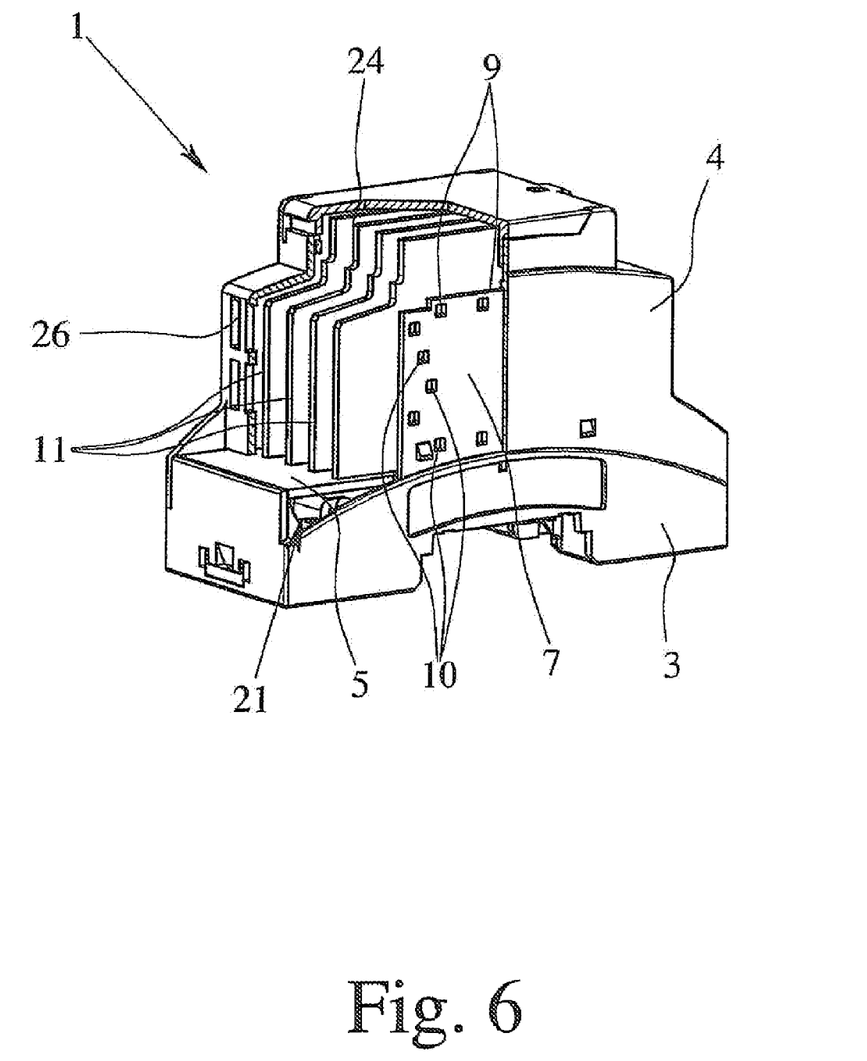
FIG. 6 is a partial cut-away view of an electronics housing according to a fifth embodiment of the present invention.

As may be seen from FIG. 2, and also in FIGS. 4-6, the base part 3 has two side walls 7, 8, which are situated on diametrically opposite sides, extend perpendicular to the support rail 2 and to the base circuit board 5, and in which multiple openings 9, 10 are situated. The openings 9, 10 are situated in the side walls 7, 8 in such a way that further circuit boards 11 may be situated as desired in all three spatial directions in the electronics housing 1. Retention lugs 12 corresponding to the openings 9, 10, which may engage in the openings 9, 10, are milled onto the circuit boards 11.

In the exemplary embodiment shown in FIG. 4, the further circuit boards 11 are attached to the side walls 7, 8 in such a way that the circuit boards 11 run parallel to the base circuit board 5. In contrast to this, the circuit boards 11 in the exemplary embodiment shown in FIG. 5 are situated perpendicular to the base circuit board 5 and perpendicular to the side walls 7, 8. In the exemplary embodiment shown in FIG. 6, the circuit boards 11 are also oriented perpendicular to the base circuit board 5, but parallel to the side walls 7, 8 of the base part 3. The circuit boards 11 are fixed in the spatial direction shown in FIG. 6 by circuit board guides situated in the upper part 4, in which the edges of the circuit boards 11 may be at least partially inserted.

In the embodiments shown, base part 3 and upper part 4 are connected using a catch connection, for which appropriate catch lugs 13 are implemented on the side walls 7, 8 of the base part 3 and catch openings 14 corresponding thereto are implemented in the upper part 4. The catch between the base part 3 and upper part 4 is implemented in such a way that the base part 3 and the upper part 4 may be connected to one another without tools. If the upper part 4 is to be removed from the base part 3, the tip of a tool, such as a screwdriver, may be inserted through the catch recess 14 in the upper part for this purpose, through which the catch lugs 13 may be pressed out of the catch recesses 14 from the inside.

Figure 3:
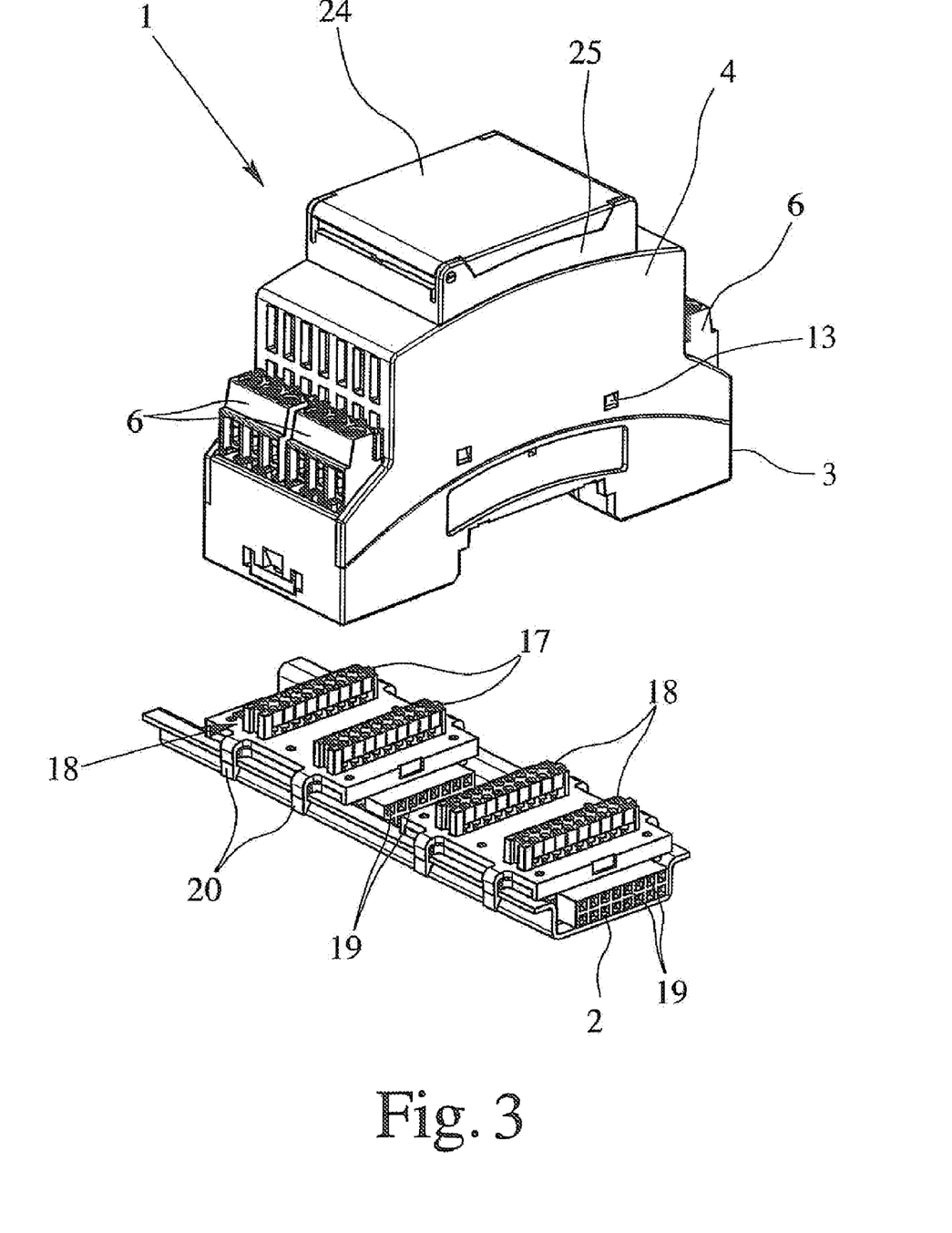
FIG. 3 is a side perspective view of the electronics housing of FIG. 2 and a rail according to the present invention.

It may be seen from FIG. 3 that the electronics housing 1 may not only be snapped mechanically onto the support rail 2 via the base part 3, but can also be electrically connectable to the neighboring electronics housings 1 or devices. For this purpose, an opening 15 is implemented in the bottom of the base part 3, through which the pin contacts 16 connected to the base circuit board 5 project out of the electronics housing 1, as illustrated in FIG. 2.

When the base part 3 is snapped onto the support rail 2, the pin contacts 16 contact corresponding sockets 17 of a bus connector 18 situated in the support rail 2. The approximately T-shaped bus connectors 18 are implemented so that multiple bus connectors 18 may be plugged together, through which a transverse connection between the individual electronics housing 1 plugged onto the support rail and/or the bus connectors 18 automatically results.

For this purpose, the bus connectors 18 have pin contacts 19 oriented in the longitudinal direction of the support rail 2 and—on the diametrically opposite side—corresponding socket contacts. The bus connectors 18 are attachable to the support rail 2 using corresponding catch arms 20 in such a way that the bus connectors 18 may still be displaced in the longitudinal direction of the support rail 2 even after being snapped onto the support rail 2.

The base part 3 and thus also the electronics housing 1 as a whole is mechanically attached to the support rail 2 with the aid of two bolts 21 situated in the base part 3, at least one of which is situated so it is displaceable perpendicular to the longitudinal direction of the support rail 2 and is preferably spring-loaded. The bolts 21 each have a catch lug 22, which engages below the two horizontal legs of the support rail 2 when the base part 3 is placed on the support rail 2 and thus latches the base part 3 on the support rail 2. In order to remove the base part 3 from the support rail 2, the displaceably situated and spring-loaded bolt 21 must be retracted against its spring force, for which the bolt 21 has an unlocking section 23 having an opening, into which the tip of a screwdriver may be inserted from the outside, on its end diametrically opposite the catch lug 22.

The upper part 4 of the electronics housing 1 has a cover 24 on its top, which is held pivotably on a frame 25 implemented on the upper part 4. The cover 24 may either be produced from the same material and in the same color as the upper part 4 or from a transparent or semi-opaque material. A corresponding latch may be implemented between the cover 24 and the frame 25 to fix the cover 24 in the closed position. In addition, however, it is also possible to seal the cover 24 in the closed position through a lead seal. This may be advantageous if parameterization of the electrical device, which is only to be changed in special cases, is to be performed with cover 24 open with the aid of buttons or setting potentiometers situated below the cover 24.

Figure 7:
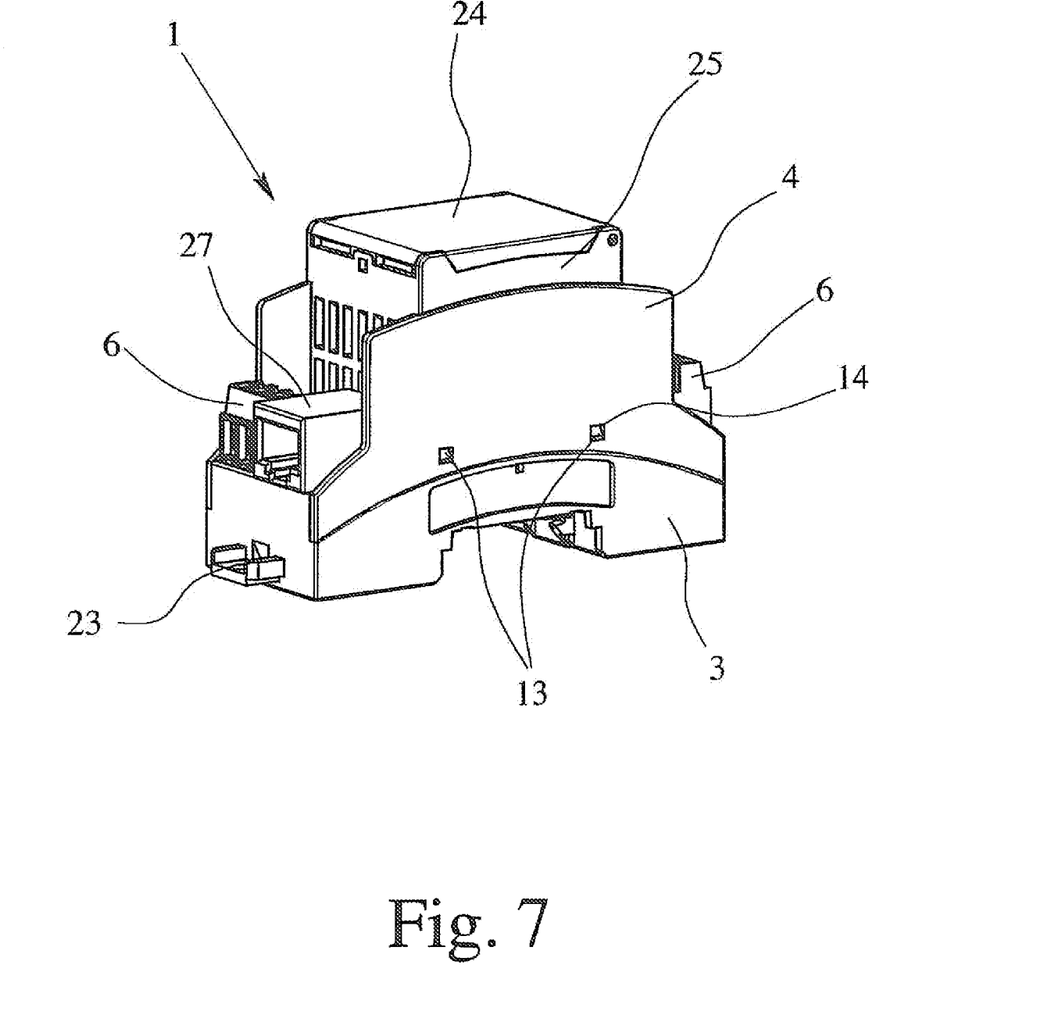
FIG. 7 is a perspective view of an electronics housing according to a sixth embodiment of the present invention.

It may be seen from FIG. 1 that ventilation openings 26 may be implemented in the narrow sides of the upper part 4, in order to remove the heat arising on the circuit boards 11 from the electronics housing 1. In addition, it may be seen from FIGS. 7 and 8 that the electronics housing 1 may be provided with different connection terminals 6. All known types of connection terminals 6 are connectable to the circuit board 5 in principle, i.e., particularly screw connection terminals, tension spring clamps, or leg spring clamps. The number of terminals provided is also variable, as is immediately obvious from FIG. 8.

In addition, the possibility also exists of connecting connection terminals 6 or connection plugs and/or connection sockets 27, which project beyond the edge of the front face of the electronics housing 1, to the circuit board 5. This flexibility in the selection of the connection terminals 6 or connection plugs and/or connection sockets 27 is possible through the geometry of the upper part 4, which is open on the narrow sides in the area of the connection terminals 6.

While the invention has been particularly shown and described with reference to preferred embodiments thereof, it will be understood by those skilled in the art that various changes in form and details may be made therein without departing from the spirit and scope of the invention.

What is claimed is:

1. An electronics housing for placement on a support rail, the electronics housing comprising:
 a base part comprising a socket part configured to cooperate with the support rail;
 an upper part, the upper part being detachably connected to the base part;

a first housing side wall comprising a plurality of first fasteners;
a second housing side wall comprising a plurality of second fasteners, the second housing side wall being disposed opposite to the first housing wall and disposed parallel to the first housing wall, the first and second housing walls being disposed perpendicular to the support rail;
a first circuit board, the first circuit board being disposed parallel to the support rail using at least a first one of the plurality of first fasteners and at least a first one of the plurality of second fasteners; and
at least two connection terminals electrically connectable to the first circuit board and configured for connecting electrical conductors.

2. The electronics housing recited in claim 1, wherein the plurality of first and second fasteners are configured so that a second circuit board is disposed parallel to the first circuit board using at least a second one of the plurality of first fasteners and at least a second one of the plurality of second fasteners.

3. The electronics housing recited in claim 1, wherein the plurality of first and second fasteners are configured so that a second circuit board is disposed perpendicular to the first circuit board using at least a second one of the plurality of first fasteners and at least a second one of the plurality of second fasteners.

4. The electronics housing recited in claim 3, further comprising:
a plurality of circuit board guides disposed in the upper part,
wherein the plurality of first and second fasteners and the plurality of circuit board guides are configured so that a third circuit board is disposed parallel to the first circuit board using at least a third one of the plurality of first fasteners, at least a third one of the plurality of second fasteners, and at least one of the plurality of circuit board guides.

5. The electronics housing recited in claim 1, wherein the first and second housing side walls are disposed on the base part.

6. The electronics housing recited in claim 1, wherein the connection terminals comprise plug-in connectors.

7. An electronics housing for placement on a support rail, the electronics housing comprising:
a base part, the base part comprising:
a first side wall;
a second side wall, the first and second side walls being disposed diametrically opposite each other and extending perpendicular to the support rail;
a socket part, the socket part being detachably attachable to the support rail;
an upper part, the upper part being latchable to the base part;
a first circuit board, the first circuit board being disposed in the base part and parallel to the support rail;
at least two connection terminals electrically connectable to the first circuit board; and
a plurality of fasteners disposed in the first and second side walls and configured to engage a second circuit board such that the second circuit board is disposed perpendicular to the first circuit board.

8. The electronics housing recited in claim 7, wherein the first and second side walls are at least partially covered by the upper part.

9. The electronics housing recited in claim 7, further comprising:
a plurality of circuit board guides disposed in the upper part,
wherein the second circuit board is engaged in a respective position using at least one of the plurality of circuit board guides.

10. The electronics housing according to claim 7, further comprising:
first respective plug contacts disposed on the second circuit board;
second respective plug contacts disposed on a third circuit board,
wherein the second circuit board is electrically connected to the third circuit board via the first and second respective plug contacts.

11. The electronics housing recited in claim 7, further comprising:
an opening disposed in a bottom of the base part; and
a plurality of contacts disposed on the first circuit board, the plurality of contacts being configured to plug into corresponding counter contacts when the base part is attached onto the support rail.

12. The electronics housing recited in claim 7, further comprising:
a lock disposed in the base part,
wherein the base part is removably connectable to the support rail via the lock.

13. The electronics housing recited in claim 7, further comprising:
a lock comprising at least one spring-loaded bolt, the bolt comprising:
a catch lug; and
an externally accessible unlocking section;
the lock being displaceably disposed in the base part;
the catch lug being configured to engage below a leg of the support rail in a locked position of the lock; and
the unlocking section being usable to bring the lock into an unlocked position.

14. The electronics housing recited in claim 7, wherein the connection terminals are plug-in connectors connectable to the circuit board.

15. The electronics housing recited in claim 7, further comprising:
a cover disposed on the upper part.

16. The electronics housing recited in claim 15, further comprising:
a display element disposed below the cover,
wherein the cover is made of a transparent material such that the display element is visible through the cover.

17. The electronics housing recited in claim 7, wherein the upper part comprises ventilation openings.

18. The electronics housing recited in claim 7, wherein the second circuit board is electrically connected to a third circuit board another via the first circuit board.

19. The electronics housing recited in claim 7, wherein the plurality of fasteners is configured to engage the second circuit board such that the second circuit board is disposed parallel to the first and second side walls.

20. The electronics housing recited in claim 7, wherein the plurality of fasteners is configured to engage the second circuit board such that the second circuit board is disposed perpendicular to the first and second side walls.

* * * * *